US007102927B2

(12) United States Patent
Jo

(10) Patent No.: US 7,102,927 B2
(45) Date of Patent: Sep. 5, 2006

(54) MEMORY DEVICES AND PROGRAMMING METHODS THAT SIMULTANEOUSLY STORE ERASE STATUS INDICATIONS FOR MEMORY BLOCKS

(75) Inventor: Seong-Kue Jo, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 11 days.

(21) Appl. No.: 10/939,197

(22) Filed: Sep. 10, 2004

(65) Prior Publication Data
US 2006/0018158 A1      Jan. 26, 2006

(30) Foreign Application Priority Data
Jul. 20, 2004   (KR) ..................... 10-2004-0056483

(51) Int. Cl.
*G11C 16/08* (2006.01)
*G11C 16/16* (2006.01)

(52) U.S. Cl. ..................... 365/185.12; 365/185.17; 365/185.23; 365/185.33; 365/185.29

(58) Field of Classification Search .......... 365/185.33, 365/185.29, 185.17, 185.12, 185.11, 185.23
See application file for complete search history.

(56) References Cited

U.S. PATENT DOCUMENTS

| 5,299,162 | A |  | 3/1994 | Kim et al. | ............. | 365/185.17 |
|---|---|---|---|---|---|---|
| 5,473,563 | A |  | 12/1995 | Suh et al. | ............... | 365/185.13 |
| 5,696,717 | A |  | 12/1997 | Koh | ....................... | 365/185.22 |
| 5,841,721 | A |  | 11/1998 | Kwon et al. | ................. | 365/218 |
| 5,999,446 | A |  | 12/1999 | Harari et al. | ........... | 365/185.03 |
| 6,493,037 | B1 | * | 12/2002 | Raiyat | ......................... | 348/564 |
| 6,507,885 | B1 | * | 1/2003 | Lakhani et al. | ................. | 711/5 |
| 6,587,915 | B1 |  | 7/2003 | Kim | ............................. | 711/103 |
| 6,587,925 | B1 |  | 7/2003 | Arimilli et al. | .............. | 711/122 |
| 2002/0099903 | A1 |  | 7/2002 | Lakhani et al. | .............. | 711/103 |
| 2004/0172576 | A1 |  | 9/2004 | Yoshii et al. | ................... | 714/6 |

FOREIGN PATENT DOCUMENTS

JP        2003-109384 A        4/2003

* cited by examiner

*Primary Examiner*—Andrew Q. Tran
(74) *Attorney, Agent, or Firm*—Myers Bigel Sibley & Sajovec

(57) ABSTRACT

Methods are provided to program a memory device having a plurality of memory blocks. A first address for selecting a row of each of the memory blocks is generated according to a multi-page program operation. A second address for selecting a memory block is received and latched, which is repeated until second addresses of memory blocks to be selected are all received and latched. Memory blocks are selected by the latched second addresses, and then the same rows of the respective selected memory blocks are simultaneously activated according to the first address. Related memory devices also are described.

44 Claims, 6 Drawing Sheets

MEMORY DEVICES AND PROGRAMMING METHODS THAT SIMULTANEOUSLY STORE ERASE STATUS INDICATIONS FOR MEMORY BLOCKS

RELATED APPLICATION

This application claims the benefit under 35 U.S.C. §119 of Korean Patent Application No. 2004-0056483, filed Jul. 20, 2004, the disclosure of which is hereby incorporated herein by reference in its entirety as if set forth fully herein.

FIELD OF THE INVENTION

The present invention relates to semiconductor memory devices and operating methods, and, more particularly, to block erasable memory devices and methods of operating same.

BACKGROUND OF THE INVENTION

Integrated circuit (semiconductor) memory devices are widely used in consumer and commercial applications. Semiconductor memory devices may be characterized as volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, the data are stored and can be read out as long as the power is applied, and are lost when the power is turned off. Hence, they are called volatile memories.

Non-volatile memories, such as widely used Mask Read Only Memory (MROM), Programmable Read Only Memory (PROM), Erasable Programmable Read Only Memory (EPROM), and Electrically Erasable Programmable Read Only Memory (EEPROM), are capable of storing the data even with the power turned off. The non-volatile memory data storage mode may be permanent or reprogrammable, depending upon the fabrication technology used. Non-volatile memories may be used for program and microcode storage in a wide variety of applications. A combination of single-chip volatile as well as non-volatile memory storage modes is also available in devices such as non-volatile SRAM (nvRAM) for use in systems that desire fast, programmable non-volatile memory. In addition, many special memory architectures have evolved which contain some additional logic circuitry to tailor their performance for application-specific tasks.

MROM, PROM and EPROM non-volatile memories may not be erasable and programmable by the end user. On the other hand, EEPROM devices are capable of electrically being erased or written. Accordingly, the EEPROM devices may be used in an auxiliary memory or for system programming where continuous update is desired. In particular, a flash EEPROM may have a higher integration density than a conventional EEPROM and thus may be used for a large auxiliary memory. A NAND-type flash EEPROM (hereinafter, referred to as a "NAND-type flash memory") may have a higher integration density than the well-known NOR-type flash EEPROM.

A non-volatile memory device such as a flash memory device includes a memory cell array as a storage area for storing information, which includes a plurality of memory blocks BLK0–BLKn, as illustrated in FIG. 1. Each memory block is divided into a main field 10 and a spare field 20. The spare field of each memory block stores information related to both the main field 10 and the flash memory device, such as error correction codes, device codes, other codes, block information, page information, and the like. Each memory block includes a plurality of cell strings (also referred to as NAND strings) which are configured as illustrated in FIG. 1. A page buffer circuit is provided in the flash memory device to store and read out data in and from the memory cell array. As is well known, memory cells of the NAND-type flash memory device may be programmed and erased by means of Fowler-Nordheim (F-N) tunneling current. Erase and program methods of the memory device are disclosed in U.S. Pat. No. 5,473,563 entitled "Nonvolatile Semiconductor Memory" and U.S. Pat. No. 5,696,717 entitled "Nonvolatile Integrated Circuit Memory Devices Having Adjustable Erase/Program Threshold Voltage Verification Capability" the disclosures of which are hereby incorporated herein by reference in their entirety as if set forth fully herein.

As is well known, a flash memory device includes a memory cell array that is divided into a number of memory blocks. A read/erase/program operation of respective memory blocks is made individually. A time taken to erase memory blocks may be a factor limiting the performance of a system comprising a flash memory device as well as the performance of the flash memory device itself. In attempts to solve this potential drawback, techniques for erasing a plurality of memory blocks simultaneously are disclosed in U.S. Pat. No. 5,841,721 entitled "Multi-Block Erase And Verification Circuit In A Nonvolatile Semiconductor Memory Device And A Method Thereof" and U.S. Pat. No. 5,999,446 entitled "Multi-State Flash EEPROM System With Selective Multi-Sector Erase", the disclosures of which are hereby incorporated herein by reference in their entirety as if set forth fully herein.

Once memory blocks are erased, information indicating that the memory block is erased is stored in a spare field of the erased memory block. Such information is called "block information". In other words, block information of a memory block is stored at a specific location of its spare field. The block information can be 1-bit data. Conventionally, in all memory blocks, this block information is stored at the same location of a spare field of a corresponding memory block. For example, as illustrated in FIG. 1, block information is stored at a memory cell (marked by a dotted line) which is arranged at an intersection of a first word line WL0 of each memory block and a spare bit line SBL0.

SUMMARY OF THE INVENTION

A memory device having a plurality of memory blocks is programmed, according to some embodiments of the present invention, by sequentially storing a corresponding erase status indication for a corresponding memory block in a register that is outside the plurality of memory blocks, in response to sequentially erasing the corresponding memory blocks. Then, the corresponding erase status indications that were sequentially stored in the register that is outside the plurality of memory blocks are simultaneously stored in the corresponding memory blocks. In some embodiments, corresponding status indications are simultaneously stored in a corresponding spare memory area in the corresponding memory blocks. In other embodiments the corresponding erase status indications are simultaneously stored in a same address of a corresponding spare memory area in the corresponding memory blocks.

In accordance with other embodiments of the present invention, there are provided methods of programming a non-volatile memory device having a plurality of memory blocks. Specifically, a first address for selecting a row of each of the memory blocks is generated in response to a multi-page program operation. A second address for selecting a memory block is received and latched until second addresses of memory blocks to be selected are all received and latched. Finally, memory blocks of the latched second addresses are selected to simultaneously activate the same rows of the respective selected memory blocks in response to the first address.

In exemplary embodiments, when the same rows of the selected memory blocks are activated at the same time, the same data is programmed at memory cells that are disposed at intersections of the activated rows and a column, respectively. The column is disposed at a spare field and is shared by the memory blocks. At the multi-page program operation, a memory cell is programmed per memory block so as to store data indicating whether a corresponding memory block is erased.

In exemplary embodiments, in the multi-page program operation, the activated row in each of the selected memory blocks is supplied with a program voltage and inactivated rows in each of the selected memory blocks are supplied with a pass voltage. The first address may be internally generated during the multi-page program operation. In other exemplary embodiments, the first address is generated from an external address during the multi-page program operation.

Memory devices according to some embodiments of the present invention include a plurality of memory blocks and a register that is outside the plurality of memory blocks. Control logic also is provided that is configured to sequentially store a corresponding erase status indication for a corresponding memory block in the register, in response to sequentially erasing the corresponding memory blocks. The control logic is further configured to simultaneously store the corresponding erase status indications that were sequentially stored in the register, in the corresponding memory blocks. As was described above, the erase status indications may be stored in a corresponding spare memory area, and, in some embodiments, in a same address of the corresponding spare memory area.

In accordance with other aspects of the present invention, a non-volatile memory device is provided which comprises a plurality of memory blocks, each having a plurality of word lines. A row decoder circuit is configured to store block addresses of memory blocks to be selected and to generate a page address for selecting a word line in each of the memory blocks in a multi-page program operation. A control logic circuit is configured to control the row decoder circuit so that the same word lines of corresponding memory blocks to the stored block addresses are activated at the same time during the multi-page program operation.

In exemplary embodiments, when the same word lines of the corresponding memory blocks to the stored block addresses are simultaneously activated, the same data is programmed in memory cells that are disposed at intersections of the activated word lines and a bit line respectively. The bit line is disposed at a spare field and is shared by the memory blocks.

DETAILED DESCRIPTION

Figure 1:
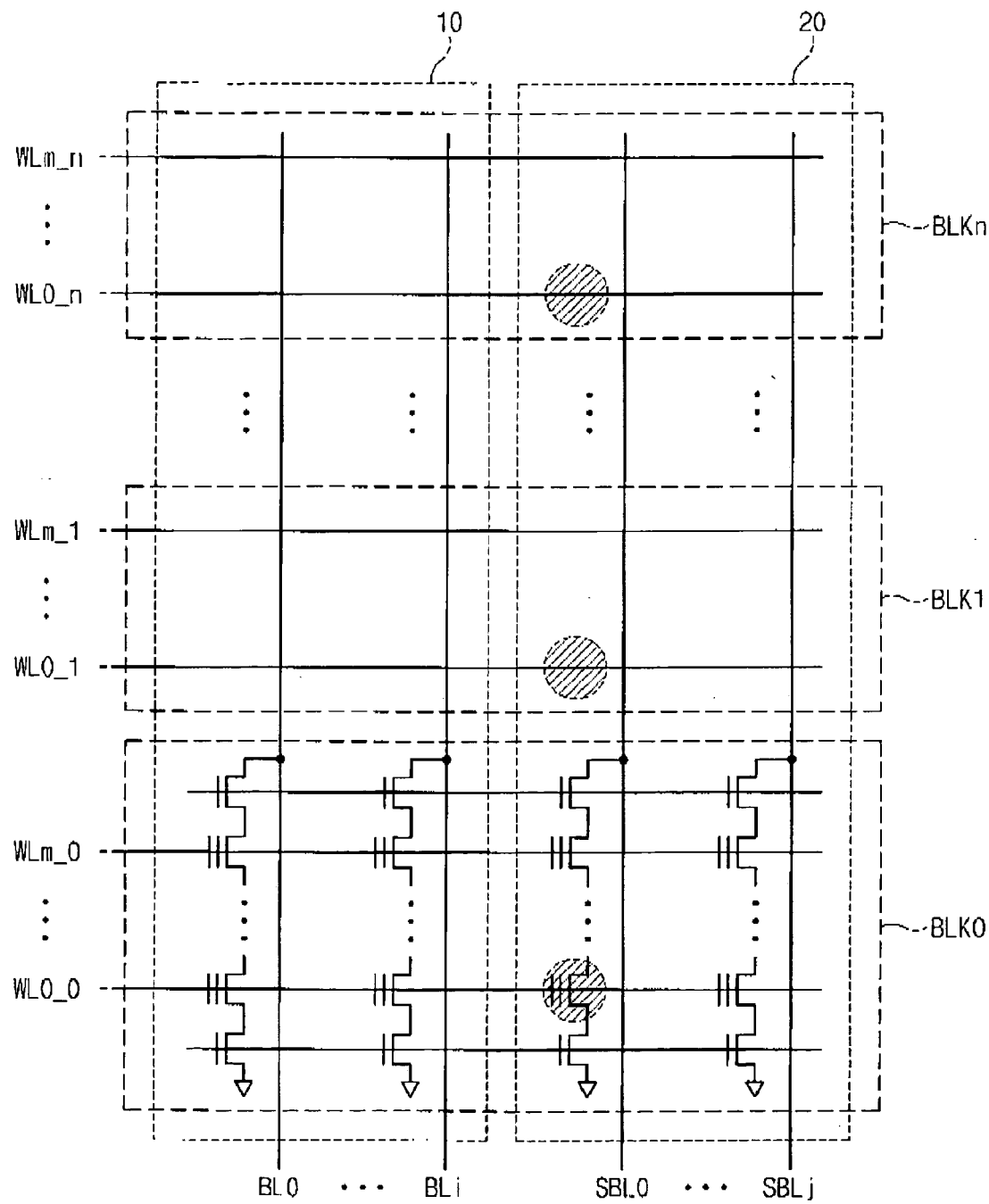
FIG. 1 is a diagram showing an array structure of a conventional non-volatile memory device.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first page could be termed a second page, and, similarly, a second page could be termed a first page without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It also will be understood that, as used herein, the terms "row" and "column" indicate two non-parallel directions that may be orthogonal to one another. However, the terms row and column do not indicate a particular horizontal or vertical orientation.

Figure 2:
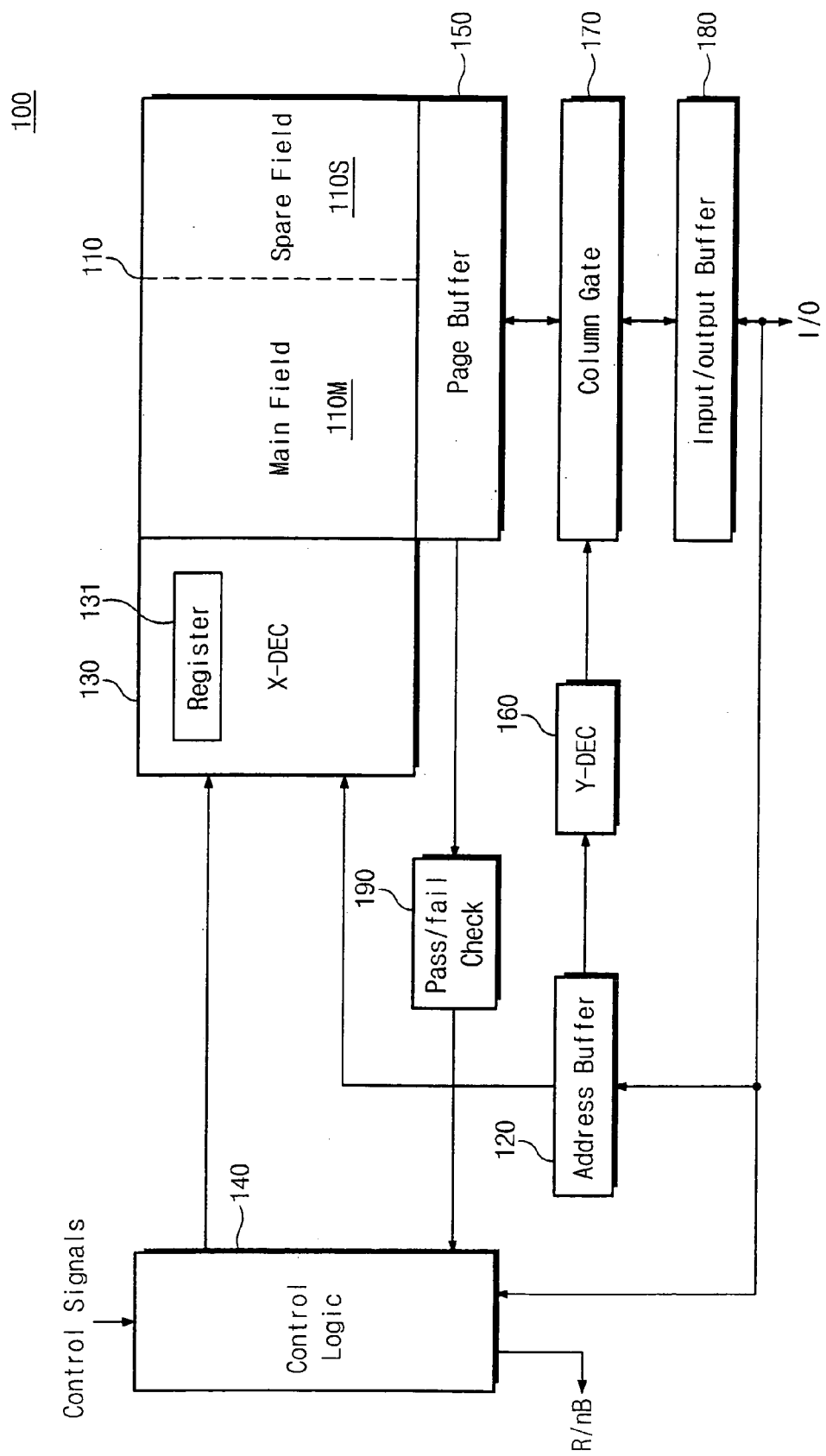
FIG. 2 is a block diagram showing a non-volatile memory device according to exemplary embodiments of the present invention.

FIG. 2 schematically shows a non-volatile memory device according to exemplary embodiments of the present invention. A non-volatile memory device according to exemplary embodiments of the present invention is a NAND-type flash memory device. However, it will be understood by one skilled in the art that the present invention may be applied to other semiconductor memory devices, such as MROM, PROM, FRAM, NOR-type flash memory devices, and the like.

Referring to FIG. 2, the non-volatile memory device 100 includes a memory cell array 110 for storing data information, which comprises a plurality of memory blocks. Each of the memory blocks is divided into a main field 110M and a spare field 110S. The main and spare fields 110M and 110S of each memory block may be configured as illustrated in FIG. 1, and description thereof is thus omitted. A non-volatile memory device 100 according to exemplary embodiments of the present invention further comprises an address buffer circuit 120, a row decoder circuit 130, control logic 140, a page buffer circuit 150, a column decoder circuit 160, a column gate circuit 170, an input/output buffer circuit 180, and a pass/fail check circuit 190.

The address buffer circuit 120 is controlled by the control logic 140 and receives column and row addresses via input/output pins I/Oi according to a given timing. The row decoder circuit 130 is controlled by the control logic 140 and operates responsive to a row address from the address buffer circuit 120. In a single-page program operation, the row address comprises block address information for selecting a memory block and page address information for selecting pages (or word lines) of the selected memory block. On the other hand, in a multi-page program operation, the row address may only include block address information for selecting a memory block. This will be described below. The row decoder circuit 130 responds to the received row address and selects one of memory blocks. The row decoder circuit 130 drives word lines (or pages) of the selected memory block with corresponding word line voltages according to a mode of operation.

A row decoder circuit 130 according to exemplary embodiments of the present invention includes a register 131, which is configured to temporarily store block addresses for selecting all or selected ones of memory blocks at the multi-page program operation. In the multi-page program operation, the block addresses in the register 131 are used to activate memory blocks at the same time. The row decoder circuit 130 internally generates a page address in the multi-page program operation. Accordingly, the row decoder circuit 130 simultaneously selects plural memory blocks using block addresses in the register 131 and activates a specific word line of each of selected memory blocks according to the internally generated page address. That is, the same word lines of selected memory blocks are simultaneously activated in the multi-page program operation.

Accordingly, exemplary embodiments of the present invention are configured to sequentially store a corresponding erase status indication for a corresponding memory block in the register 131 in response to sequentially erasing the corresponding memory blocks. These embodiments are further configured to simultaneously store the corresponding erase status indications that were sequentially stored in the register 131, in the corresponding memory blocks.

Still referring to FIG. 2, the page buffer circuit 150 includes a plurality of page buffers (not shown) that are connected to bit lines (shared by all memory blocks) respectively, and acts as a sense amplifier and a write driver according to a mode of operation. For example, in a read operation, the page buffer circuit 150 senses data from a selected memory block (e.g., main and spare fields or a spare field) via bit lines. In a single-page/multi-page program operation, the page buffer circuit 150 latches data to be programmed and drives bit lines with a program voltage (e.g., a ground voltage) or a program-inhibit voltage (e.g., a power supply voltage) based on the latched data. The column decoder circuit 160 decodes a column address from the address buffer circuit 120, and the column gate circuit 170 selects page buffers of the page buffer circuit 150 in a bit organization unit in response to the decoded address signals from the column decoder circuit 160. In a read operation, data read by the page buffer circuit 150 is output via the column gate circuit 170 and the input/output buffer circuit 180. In a program operation, data to be programmed is transferred to the page buffer circuit 150 via the column gate circuit 170 and the input/output buffer circuit 180. The pass/fail check circuit 190 receives data bits read by the page buffer circuit 150 at a program/erase verify operation and judges whether the received data bits have the same value (that is, pass data value). A judgment result of the pass/fail check circuit 190 is transferred to the control logic 140.

Exemplary page buffer and pass/fail check circuits are disclosed in U.S. Pat. No. 5,299,162 entitled "Nonvolatile Semiconductor Memory Device And An Optimizing Programming Method Thereof", the disclosure of which is hereby incorporated herein by reference in its entirety as if set forth fully herein.

Although not shown in FIG. 2, the column decoder circuit 160 can also include an address counter, which successively generates column addresses by sequentially increasing an initial column address. Thus, page data to be programmed/read is sequentially transferred via the column gate circuit 170 in a bit organization unit.

Still referring to FIG. 2, the control logic 140 is configured to control a multi-page program mode where all or ones of memory blocks in the memory cell array 110 are simultaneously selected and the same word lines of the selected memory blocks are simultaneously activated. Further, the control logic 140 controls a single-page program mode where a memory block is selected and a word line in the selected memory block is activated. The control logic 140 judges address, command and data input timings in response to conventional control signals, such as conventional CLE, ALE, /CE, /RE, and /WE signals. In the multi-page program mode, the control logic 140 controls the address buffer circuit 120 and the row decoder circuit 140 so that block addresses for selecting all or ones of memory blocks are sequentially stored in the register 131 of the row decoder circuit 130 through the address buffer circuit 120. The control logic 140 controls the row decoder circuit 130 so that memory blocks of block addresses in the register 131 are selected at the same time and a specific word line in each of the selected memory block is driven (or activated) with a program voltage. This will be described more fully below. It will be understood by those having skill in the art that the control logic 140 may be embodied as hardware and/or software.

Figure 3:
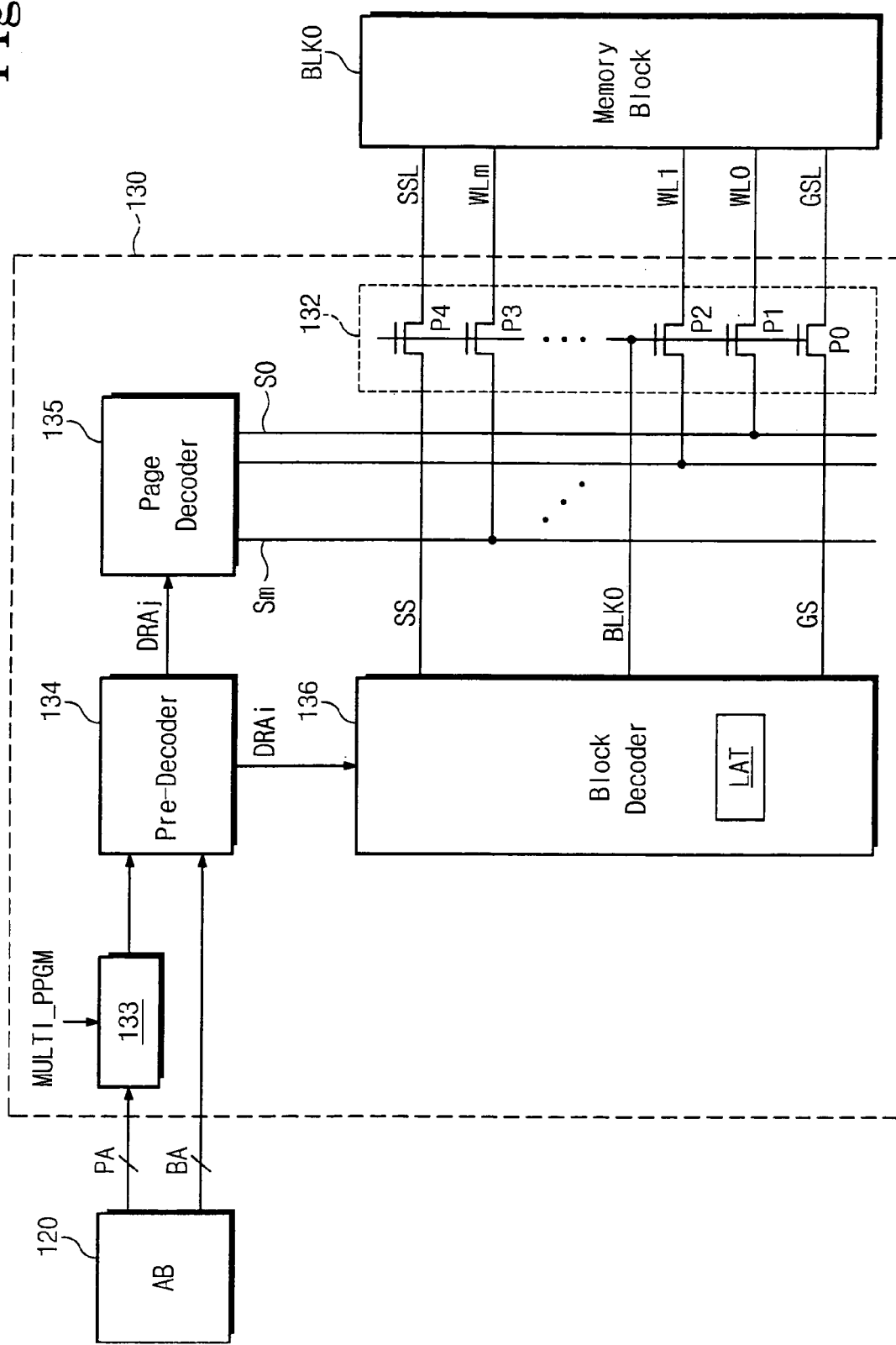
FIG. 3 is a block diagram showing a row decoder circuit of FIG. 2 according to exemplary embodiments of the present invention.
Figure 4:
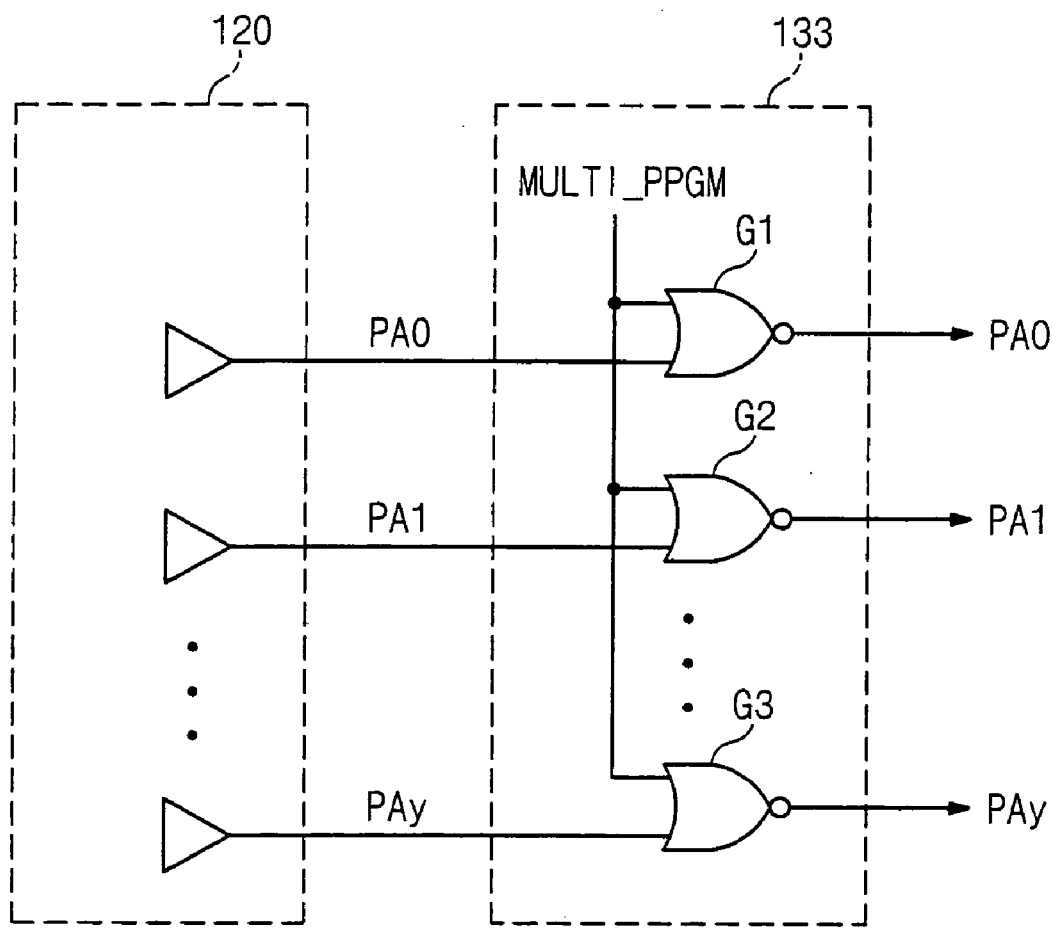
FIG. 4 is a logic circuit diagram showing an address generator circuit of FIG. 3 according to exemplary embodiments of the present invention.

FIG. 3 is a schematic block diagram showing an embodiment of the row decoder circuit in FIG. 2, and FIG. 4 is a circuit diagram showing an embodiment of the address generator circuit in FIG. 3.

Referring to FIG. 3, a row decoder circuit 130 according to exemplary embodiments of the present invention comprises a switch circuit 132, an address generator circuit 133, a pre-decoder circuit 134, a page decoder circuit 135, and a block decoder circuit 136. The switch circuit 132 includes select transistors P0–P4 that correspond to a string select line SSL, word lines WLm–WL0 and a ground select line GSL, respectively. The string select line SSL, the word lines WLm–WL0 and the ground select line GSL are connected to select lines SS, Sm–S0 and GS via corresponding select transistors P0–P4, respectively. The address generator circuit 133 generates a page address in response to a multi-page program signal MULTI_PPGM.

For example, referring to FIG. 4, the address generator circuit 133 transfers a page address PA from an address buffer circuit 120 to a pre-decoder circuit 134 without modification when the multi-page program signal MULTI_PPGM has a low level indicating a single-page program operation. When the multi-page program signal MULTI_PPGM has a high level indicating a multi-page program operation, the address generator circuit 133 outputs a page address for selecting a specific word line (e.g., WL0) regardless of a page address PA from the address buffer circuit 120. That is, in the multi-page program operation, a specific word line of memory blocks (in this embodiment, WL0 of each memory block) will be selected without an external page address. The multi-page program signal MULTI_PPGM is generated from the control logic 140 in FIG. 2 so as to be activated at an input of a multi-page select command (CMD1 of FIG. 6) and inactivated at completion of the multi-page program operation.

Returning to FIG. 3, the pre-decoder circuit 134 decodes a block address BA from the address buffer circuit 120 and a page address PA from the address generator circuit 133. The decoded address comprises block select information (that is, a block address) and page select information (that is, a page address). The page address DRAj of the decoded address is output to the page decoder circuit 135, and the block address DRAi of the decoded address is output to the block decoder circuit 136.

The page decoder circuit 135 selects S0–Sm lines corresponding to word lines WL0–WLm in response to the page address DRAj from the pre-decoder circuit 134. For example, in a single-page/multi-page program mode, the page decoder circuit 135 supplies a program voltage to a select line corresponding to a page address and a pass voltage to the remaining select lines. In a read mode, the page decoder circuit 135 supplies a read voltage to a select line corresponding to a page address and a pass voltage to the remaining select lines.

The block decoder circuit 136 activates/inactivates a block select signal BLKS0 in response to the block address DRAi from the pre-decoder circuit 134. The select transistors P0–P4 are controlled in common by the block select signal BLKS0. The activated block select signal BLKS0 has a sufficiently high voltage so that high voltages of the select lines S0–Sm are transferred to corresponding word lines without voltage drop. The block decoder circuit 136, also, controls activation of the select signals SS and GS in response to the block address DRAi. In particular, the present block decoder circuit 136 includes a latch LAT for storing a block address of a corresponding memory block in the multi-page program operation.

The page decoder circuit 135 is shared by memory blocks BLK0–BLKn, while the block decoder circuit 136 is dedicated to one memory block. In other words, select signals S0–Sm from the page decoder circuit 135 are applied in common to all memory blocks, while a block select signal BLKS and select signals GS and SS are only applied to a corresponding memory block.

Figure 5:
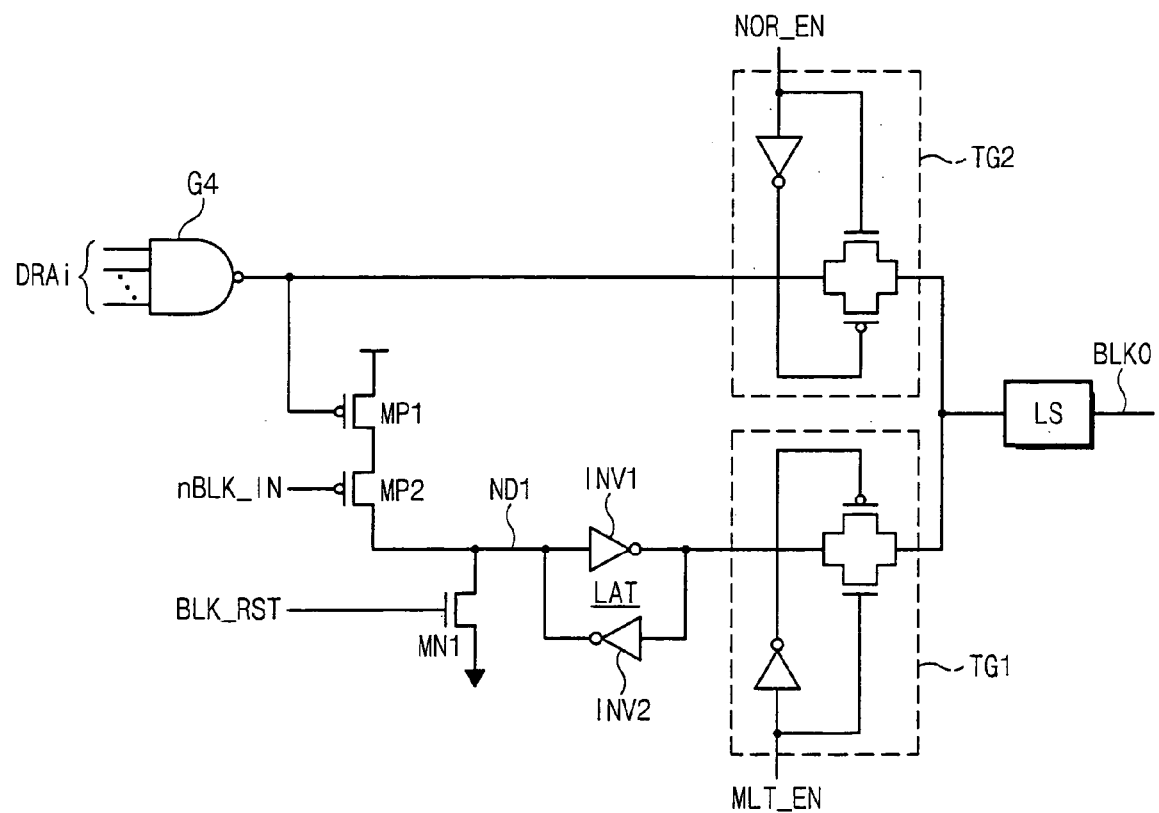
FIG. 5 is a logic circuit diagram showing a block decoder circuit of FIG. 3 according to exemplary embodiments of the present invention.

FIG. 5 is a circuit diagram showing a block decoder circuit illustrated in FIG. 3 according to exemplary embodiments of the present invention.

Referring to FIG. 5, the block decoder circuit 136 comprises a NAND gate G4, PMOS transistors MP1 and MP2, an NMOS transistor MN1, a latch LAT consisting of inverters INV1 and INV2, transmission gates TG1 and TG2, and a level shifter LS. Latches LAT of block decoder circuits corresponding to memory blocks BLK0–BLKn constitute a register 131 of a row decoder circuit in FIG. 2. A decoded block address DRAi from the pre-decoder circuit 134 in FIG. 3 is applied to the NAND gate G1. The PMOS transistors MP1 and MP2 are connected in series between the power supply voltage and an input node ND 1 of the latch LAT. A gate of the PMOS transistor MP1 is connected to an output terminal of the NAND gate G4, and a gate of the PMOS transistor MP2 is connected to receive a control signal nBLK_IN. The NMOS transistor MN1 is connected between the input node ND 1 of the latch LAT and the ground voltage and is controlled by a control signal BLK_RST. The transmission gate TG1 is controlled by the control signal MLT_EN and transfers an output of the latch LAT to the level shifter LS. The transmission gate TG2 is controlled by a control signal NOR_EN and transfers an output of the NAND gate G4 to the level shifter LS. The level shifter LS activates a block select signal BLKS0 in response to an input signal. The block select signal BLKS0 has a high voltage sufficient to transfer high voltages of select lines S0–Sm to corresponding word lines WL0–WLm without voltage drop.

In embodiments of FIG. 5, the control signals nBLK_IN, BLK_RST, NOR_EN and MLT_EN are generated by the control logic 140 in FIG. 2.

Figure 6:
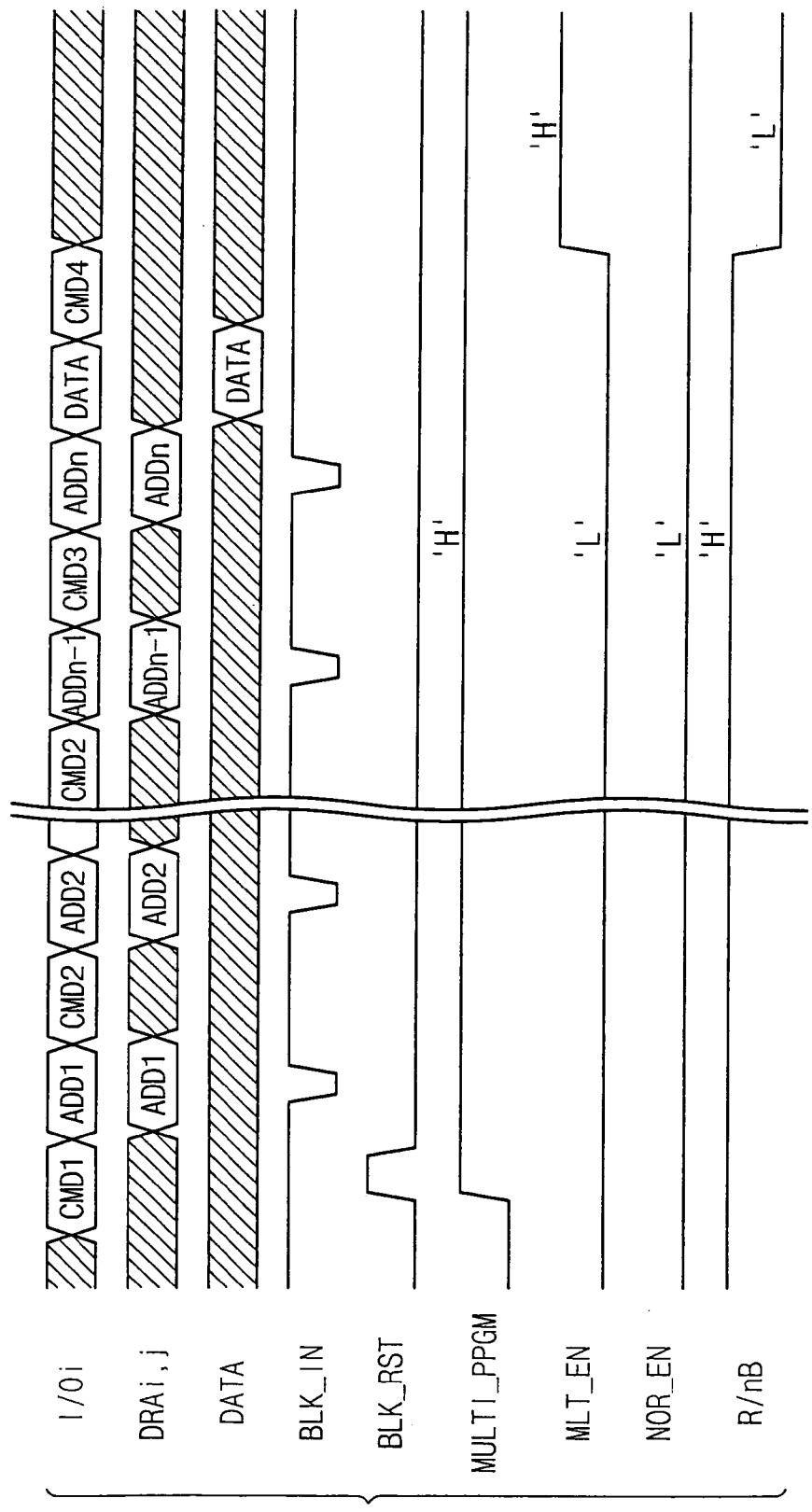
FIG. 6 is a timing diagram for describing multi-page program methods according to exemplary embodiments of the present invention.

FIG. 6 is a timing diagram for describing a multi-page program operation of a non-volatile memory device according to exemplary embodiments of the present invention. A multi-page program operation of the present non-volatile memory device will now be more fully described with reference to the accompanying drawings. Information related to a main field, such as block information indicating that a memory block is erased, is programmed in a spare field in a multi-page program mode. Unlike conventional memory devices, the present memory device stores block information related to memory blocks in spare fields of the memory blocks in parallel (simultaneously).

Referring to FIG. 6, if a first command CMD1 as a multi-page select command is received, the control logic 140 activates a control signal BLK_RST. An NMOS transistor MN1 in the block decoder circuit 136 is turned on by activation of the control signal BLK_RST, so that the latch LAT is reset. At this time, control signals MLT_EN and NOR_EN are at a low level. This means that transmission gates TG1 and TG2 are inactivated. At the same time, the control logic 140 activates a multi-page program signal MULTI_PPGM in response to an input of the first command CMD1. This enables an address generator circuit 133 in FIG. 3 to generate a page address PA for selecting a specific word line (e.g., WL0 of each memory block) irregardless of an external address (or without an input of an external address).

Then, a block address ADD1 for selecting a memory block and word lines is applied to input/output pins I/Oi. The received block address ADD1 is decoded with a page address from the address generator circuit 133 by the pre-decoder circuit 134. The block address DRAi of the decoded address is transferred to a NAND gate G4 of a block decoder circuit 136. At the same time, a decoded page address DRAj of the decoded address is provided to a page decoder circuit 135.

As illustrated in FIG. 6, when the block address ADD1 is received (or when the block address is decoded), the control logic 140 activates the control signal nBLK_IN. If the decoded block address signals are all '1', an output of the NAND gate G4 goes low and thus the PMOS transistor MP1 is turned on. Accordingly, when the control signal nBLK_IN is activated, the input node ND1 of the latch LAT has a low-to-high transition. At this time, since the transmission gates TG1 and TG2 are inactivated, the block select line BLKS0 is not driven by a level shifter LS.

With the above description, if a block address follows the first command CMD1 as a multi-page select command, the block address is stored in the latch LAT of a corresponding block decoder circuit 136 according to the control of the control logic 140. This operation is repeated until block addresses of memory blocks to be selected are all stored in corresponding block decoder circuits, respectively.

As illustrated in FIG. 6, in order to store a block address in the block decoder circuit 136 after an input of the first command CMD1, a second command CMD2 is received. The second command CMD2 is a command informing that addresses are successively received. The first command CMD1 can be used instead of the second command CMD2. As a third command CMD3 as a command informing an input of addresses and data is received, data to be programmed is loaded onto the page buffer circuit 150 via the input/output buffer circuit 180 and the column gate circuit 170. An address following the third command CMD3 comprises a block address and a column address. The column address is used to select a specific column (e.g., SBL0) of a spare field. That is, data to be programmed is loaded onto a page buffer(s) of the page buffer circuit corresponding to the spare field.

In these embodiments, data to be programmed is block information indicating that a memory block is erased. Accordingly, data to be programmed at a spare field of each memory block has the same data value.

Once block addresses of memory blocks to be selected are all stored in corresponding block decoder circuits, the control logic 140 activates the control signal MLT_EN in response to a fourth command CMD4 as a multi-page program command (or a multi-page program confirm command). As the control signal MLT_EN is activated, a value stored in the latch LAT is transferred to the level shifter LS through the transmission gate TG1. The level shifter LS drives the block select line BLKS0 with a program voltage in response to an input signal.

For example, it is assumed that block addresses for selecting three memory blocks BLK0, BLK1 and BLKn are respectively stored in corresponding block decoder circuits. With this assumption, block select lines BLKS0, BLKS1 and BLKSn are activated. As the block select lines BLKS0, BLKS1 and BLKSn are activated, a specific word line WL0 in the respective memory blocks BLK0, BLK1 and BLKn is activated by a page decoder circuit 135. As set fourth above, since the page decoder circuit 135 is shared by memory blocks, a select line S0 is driven with a program voltage by the page decoder circuit 135 based on a page address generated in an address generator circuit 133. Accordingly, the program voltage on the select line S0 is simultaneously supplied to a word line WL0 of each of the selected memory blocks BLK0, BLK1 and BLKn. At the same time, a program voltage (e.g., a ground voltage) is supplied to a spare bit line SBL0 based on a data value in a corresponding page buffer to the spare bit line SBL0 of a spare field.

Afterward, there are programmed memory cells which are arranged at intersections of the spare bit line SBL0 and word lines WL0 having the program voltage, that is, activated word lines of the selected memory blocks. Accordingly, the memory cells are simultaneously programmed to have the same data. An R/nB signal is activated low during a program interval.

Once the above program operation is completed, a conventional verify operation may be carried out to confirm whether selected (or programmed) memory cells are programmed normally. The verify operation may be identical with a read operation except that data read out by a page buffer circuit is sent to a pass/fail check circuit 190, and description thereof is thus omitted. A judgment result of the pass/fail check circuit 190 is stored in a status register (not shown) of control logic 140. Information stored in the status register is output in a well-known status read operation.

With the present multi-page programming according to exemplary embodiments of the present invention, only one program operation can be carried out to store block information related to plural memory blocks. Accordingly, embodiments of the invention can improve the performance or operating speed of a non-volatile memory device. A non-volatile memory device according to exemplary embodiments of the present invention can allow memory cells to be over-programmed, so that memory cells may be programmed by only one program operation. In the case that a judgment result of the verify operation indicates program fail, a read operation can be performed individually with respect to memory blocks BLK0, BLK1 and BLKn to find a memory block whose program operation is failed. As set fourth above, in a case where the over-program operation is allowed, memory cells of the non-volatile memory device may be programmed by only one program operation so as to have desired threshold voltages.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of programming a memory device having a plurality of memory blocks, the method comprising:
generating a first address to select a row of each of the memory blocks in response to a multi-page program operation;
receiving and latching a second address to select a memory block until second addresses of memory blocks to be selected are all received and latched; and
selecting memory blocks corresponding to the latched second addresses to simultaneously activate the same rows of the respective selected memory blocks in response to the first address.

2. The method of claim 1, wherein when same rows of the selected memory blocks are simultaneously activated, same data is programmed at memory cells that are disposed at intersections of the activated rows and a column.

3. The method of claim 2, wherein the column is disposed in a spare field and is shared by the memory blocks.

4. The method of claim 2, wherein a same memory cell is programmed per memory block so as to indicate that the corresponding memory block is erased.

5. The method of claim 1, wherein the memory blocks comprise NAND-type flash memory blocks.

6. The method of claim 1, wherein the activated row in each of the selected memory blocks is supplied with a program voltage and inactivated rows in each of the selected memory blocks are supplied with a pass voltage.

7. The method of claim 1, wherein the first address is internally generated.

8. The method of claim 1, wherein the first address is generated from an external address.

9. A method of programming a memory device having a plurality of memory blocks, the method comprising:
   receiving a block address to select a memory block;
   temporarily storing the received block address in a corresponding one of latches of a row decoder circuit, the latches of the row decoder circuit corresponding to the memory blocks, respectively;
   repeating the receiving and temporarily storing until block addresses of memory blocks to be selected are all received and stored;
   generating a page address to select a same row in each of the memory blocks; and
   simultaneously selecting memory blocks in response to the temporarily stored block addresses to simultaneously activate same rows of the respective selected memory blocks, such that same data is programmed at memory cells that are disposed at intersections of the activated rows and a column, respectively.

10. The method of claim 9, wherein the column is disposed in a spare field and is shared by the memory blocks.

11. The method of claim 10, wherein a same memory cell is programmed per memory block so as to indicate that the corresponding memory block is erased.

12. The method of claim 9, wherein the memory blocks comprise NAND-type flash memory blocks.

13. The method of claim 9, wherein, the activated row in each of the selected memory blocks is supplied with a program voltage and inactivated rows in each of the selected memory blocks are supplied with a pass voltage.

14. The method of claim 9, wherein the first address is internally generated.

15. The method of claim 9, wherein the first address is generated from an external address.

16. A memory device comprising:
   a plurality of memory blocks, each having a plurality of word lines; and
   a row decoder circuit configured to store block addresses of memory blocks to be selected and to generate a page address for selecting a word line in each of the selected memory blocks in a multi-page program operation.

17. The memory device of claim 16, further comprising control logic configured to control the row decoder circuit so that same word lines of memory blocks corresponding to the stored block addresses are activated at the same time during the multi-page program operation.

18. The memory device of claim 17, wherein when the same word lines of the corresponding memory blocks to the stored block addresses are simultaneously activated, same data is programmed in memory cells that are disposed at intersections of the activated word lines and a bit line, respectively.

19. The memory device of claim 18, wherein the bit line is disposed in a spare field and is shared by the memory blocks.

20. The memory device of claim 17, wherein the row decoder circuit comprises latches that correspond to the memory blocks and latch block addresses of corresponding memory blocks.

21. The memory device of claim 20, wherein the control logic is configured to control the row decoder circuit so that block addresses of memory blocks to be selected are stored in corresponding latches during the multi-page program operation, respectively.

22. The memory device of claim 20, wherein the control logic is configured to initialize the latches in the row decoder circuit when a multi-page select command is received at the multi-page program operation.

23. The memory device of claim 17, wherein the control logic is configured to control the row decoder circuit so that a memory block is selected without storing a block address during a single-page program operation.

24. The memory device of claim 16, wherein the memory blocks comprise NAND-type flash memory blocks.

25. The memory device of claim 16, wherein the page address is internally generated during the multi-page program operation.

26. The memory device of claim 16, wherein the page address is generated by an external address during the multi-page program operation.

27. A memory device comprising:
   a plurality of memory blocks each having a plurality of word lines;
   an address generator circuit configured to generate a page address as part of a multi-page program operation; and
   a block decoder circuit configured to store block addresses of all memory blocks to be selected in the multi-page program operation, such that same word lines of memory blocks corresponding to the stored block addresses are simultaneously activated by the page address to program the same data at memory cells that are disposed at intersections of the activated word lines and a bit line, respectively.

28. The memory device of claim 27, further comprising control logic configured to control the address generator circuit and the block decoder circuit during the multi-page program operation.

29. The memory device of claim 28, wherein the memory blocks comprise NAND-type flash memory blocks.

30. The memory device of claim 28, wherein the block decoder circuit comprises latches corresponding to the memory blocks, respectively.

31. The memory device of claim 30, wherein the control logic is configured to control the block decoder circuit so that block addresses of memory blocks to be selected are stored in corresponding latches during the multi-page program operation.

32. The memory device of claim 31, wherein the control logic is configured to initialize the latches in the block decoder circuit when a multi-page select command is received during the multi-page program operation.

33. The memory device of claim 28, wherein the control logic is configured to control the block decoder circuit so that a memory block is selected without storing a block address during a normal program operation.

34. The memory device of claim 27, wherein the bit line is disposed in a spare field and is shared by the memory blocks.

35. A method of programming a memory device having a plurality of memory blocks, the method comprising:
   sequentially storing a corresponding erase status indication for a corresponding memory block in a register that is outside the plurality of memory blocks, in response to sequentially erasing the corresponding memory blocks; and simultaneously storing the corresponding erase status indications that were sequentially stored in the register that is outside the plurality of memory blocks, in the corresponding memory blocks.

36. A method of claim 35 wherein simultaneously storing comprises simultaneously storing the corresponding erase status indications that were sequentially stored in the register that is outside the plurality of memory blocks, in a corresponding spare memory area in the corresponding memory blocks.

37. A method of claim 35 wherein simultaneously storing comprises simultaneously storing the corresponding erase status indications that were sequentially stored in the register that is outside the plurality of memory blocks, in a same address of a corresponding spare memory area in the corresponding memory blocks.

38. A method of claim 35:

wherein sequentially storing comprises generating a first address to select a row of each of the memory blocks in response to a multi-page program operation, and receiving and latching a second address to select a memory block until second addresses of memory blocks to be selected are all received and latched; and wherein simultaneously storing comprises selecting memory blocks corresponding to the latched second addresses to simultaneously activate the same rows of the respective selected memory blocks in response to the first address.

39. A method of claim 35:

wherein sequentially storing comprises receiving a block address to select a memory block to temporarily store the received block address in a corresponding one of latches of a row decoder circuit, the latches of the row decoder circuit corresponding to the memory blocks, respectively, and repeating the receiving until block addresses of memory blocks to be selected are all received and stored; and wherein simultaneously storing comprises generating a page address to select a same row in each of the memory blocks, and simultaneously selecting memory blocks in response to the temporarily stored block addresses to simultaneously activate same rows of the respective selected memory blocks, such that same data is programmed at memory cells that are disposed at intersections of the activated rows and a column, respectively.

40. A memory device comprising:

a plurality of memory blocks;

a register that is outside the plurality of memory blocks; and control logic that is configured to sequentially store a corresponding erase status indication for a corresponding memory block in the register, in response to sequentially erasing the corresponding memory blocks, and that is further configured to simultaneously store the corresponding erase status indications that were sequentially stored in the register, in the corresponding memory blocks.

41. A memory device of claim 40 wherein the control logic is further configured to simultaneously store by simultaneously storing the corresponding erase status indications that were sequentially stored in the register, in a corresponding spare memory area in the corresponding memory blocks.

42. A memory device of claim 40 wherein the control logic is further configured to simultaneously store by simultaneously storing the corresponding erase status indications that were sequentially stored in the register, in a same address of a corresponding spare memory area in the corresponding memory blocks.

43. A memory device of claim 40 wherein the plurality of memory blocks each includes a plurality of word lines, the memory device further comprising:

a row decoder circuit configured to store block addresses of memory blocks to be selected and to generate a page address for selecting a word line in each of the memory blocks in a multi-page program operation.

44. A memory device of claim 40 wherein the plurality of memory blocks each includes a plurality of word lines, the memory device further comprising:

an address generator circuit configured to generate a page address at a multi-page program operation; and a block decoder circuit configured to store block addresses of all memory blocks to be selected at the multi-page program operation, such that same word lines of memory blocks corresponding to the stored block addresses are simultaneously activated by the page address to program the same data at memory cells that are disposed at intersections of the activated word lines and a bit line, respectively.

* * * * *